US007876027B2

(12) United States Patent
Cochran et al.

(10) Patent No.: US 7,876,027 B2

(45) Date of Patent: Jan. 25, 2011

(54) MULTILAYER PIEZOELECTRIC AND POLYMER ULTRAWIDEBAND ULTRASONIC TRANSDUCER

(75) Inventors: Alexander Cochran, Glasgow (GB); Katherine J. Kirk, Glasgow (GB); Pablo Martin Franch, Aberdeen (GB); Aneela Abrar, Islamabad (PK)

(73) Assignee: The University of Paisley, Renfrewshire (GB)

(*) Notice: Subject to any disclaimer, the term of this patent is extended or adjusted under 35 U.S.C. 154(b) by 441 days.

(21) Appl. No.: 11/792,582

(22) PCT Filed: Dec. 12, 2005

(86) PCT No.: PCT/GB2005/004760

§ 371 (c)(1), (2), (4) Date: May 5, 2008

(87) PCT Pub. No.: WO2006/061647

PCT Pub. Date: Jun. 15, 2006

(65) Prior Publication Data

US 2009/0115290 A1 May 7, 2009

(30) Foreign Application Priority Data

Dec. 10, 2004 (GB) ................................ 0427052.6

(51) Int. Cl.
*H01L 41/04* (2006.01)

(52) U.S. Cl. ..................................................... 310/334

(58) Field of Classification Search ................ 310/334; 600/457–459
See application file for complete search history.

(56) References Cited

U.S. PATENT DOCUMENTS

| | | | | |
|---|---|---|---|---|
| 4,412,148 | A * | 10/1983 | Klicker et al. | 310/358 |
| 4,422,003 | A * | 12/1983 | Safari et al. | 310/358 |
| 4,876,776 | A * | 10/1989 | Whatmore et al. | 29/25.35 |
| 5,334,903 | A * | 8/1994 | Smith | 310/358 |
| 5,438,554 | A * | 8/1995 | Seyed-Bolorforosh et al. | 367/140 |
| 6,088,894 | A * | 7/2000 | Oakley et al. | 29/25.35 |
| 6,191,523 | B1 * | 2/2001 | Kahn et al. | 310/358 |
| 6,225,728 | B1 * | 5/2001 | Gururaja | 310/334 |
| 6,656,124 | B2 * | 12/2003 | Flesch et al. | 600/459 |
| 6,806,622 | B1 * | 10/2004 | Schmidt et al. | 310/334 |
| 6,919,668 | B2 * | 7/2005 | Nagahara et al. | 310/358 |
| 2007/0222339 | A1 * | 9/2007 | Lukacs et al. | 310/335 |

* cited by examiner

*Primary Examiner*—J. SanMartin
(74) *Attorney, Agent, or Firm*—Nixon & Vanderhye, PC

(57) ABSTRACT

A transducer for transmitting and receiving ultrasound waves and a method for constructing a transducer. The transducer having layers of a single crystal piezoelectric material stacked in a multilayer arrangement and a polymer material geometrically arranged within each layer to form a 3-1 connectivity piezoelectric and polymer composite. The multilayer arrangement includes at least two layers of different thickness. The structure allows the generation of odd and even harmonics to significantly increase bandwith without reducing signal amplitude or efficiency.

30 Claims, 3 Drawing Sheets

MULTILAYER PIEZOELECTRIC AND POLYMER ULTRAWIDEBAND ULTRASONIC TRANSDUCER

This application is a U.S. national phase of International Application No. PCT/GB2005/004760 filed Dec. 12, 2005, which designated the U.S. and claims priority to Great Britain Application No. 0427052.6 filed Dec. 10, 2004, the entire contents of each of which are hereby incorporated by reference.

The present invention relates to an apparatus for transmitting and receiving ultrasonic waves, in particular to an ultra-wideband ultrasonic transducer and method of fabrication.

Ultrasonic transducers are used to help create ultrasonic based images, such as scanned foetuses in the womb. Ultrasonic transducers are also widely used in non-destructive testing (NDT) and other target markets for such transducers are biomedical diagnosis and sonar.

An ultrasonic transducer typically consists of an ultrasonic transmitting and receiving element, which is typically constructed from piezoelectric material connected to electrodes.

Ultrasonic transducers have a multitude of applications, including detection of flaws in materials, dimensional measurements, material characterisation, and biomedical imaging. By using a standard pulse-echo technique, measurements can be carried out using a single transducer operating as transmitter and receiver. The pulse-echo technique is sensitive to both surfaces and flaws, and has the added advantage that only single side access is required for imaging purposes.

There are inherent difficulties in using conventional ultrasonic transducers for certain applications, such as biomedical imaging. The non-linear response of human tissue means that harmonic signals are generated when ultrasonic waves impinge on human tissue. A common solution to this problem is to transmit at a low fundamental frequency and detect the second harmonic signal of the ultrasonic wave. This requires the use of wideband transducers in order to fulfil both needs. Conventional transducers do not have the necessary bandwidth to perform such tasks efficiently. It is also possible to use such a technique in ultrasonic imaging of other materials with similar non-linear responses.

Nonetheless piezoelectric materials such as PZT (lead zirconate titanate) are widely used for medical imaging. An important reason for this is that PZT and similar ceramics have high values of longitudinal coupling constant and dielectric constant. The coupling constant dictates how well electrical energy is converted to mechanical energy and vice versa. A high dielectric constant leads to better electrical impedance matching with the system electronics.

Short wavelength, and hence high frequency, ultrasound gives high spatial resolution which is easily supported by current instrumentation but outwith the capabilities of the transducers in high frequency commercial systems.

Over the past three decades material engineers have developed piezoelectric and polymer composite materials that enable effective electromechanical properties to be tailored for a specific applications. These materials combine conventional piezoelectric ceramics with piezoelectrically passive polymers in a variety of geometrical configurations.

These transducers are highly efficient and inherently broadband. Furthermore they offer superior piezoelectric uniformity, lower acoustic impedance, lighter weight, high electromechanical coupling, and wide bandwidth, and are conformable to curved structures, which is one way of achieving focussed measurement.

The high coupling efficiency of piezoelectric and polymer composites means that the transducers have a high sensitivity and signal to noise ratio compared to conventional technology.

The connectivity in such devices also serves to increase the bandwidth while keeping good sensitivity. The connectivity of such devices is typically 1-3. 1-3 connectivity, for example, describes a composite comprising a number of piezoelectric pillars, supported by a polymer matrix. This type of structure is illustrated generally in FIG. 1. More generally the conventional composite numbering system (Newnham notation) states that the active material is mechanically connected in one direction, and the passive material is mechanically connected in three directions.

A 1-3 composite material of this kind helps to reduce parasitic vibrations, which correspond to pick up from other parts of the detector. Additionally the increased coupling coefficient, due to the effect of release of the lateral constraints within the ceramic bars, provides a better ability to transform energy than the ceramic in solid plate form.

Parasitic modes can occur for one of two reasons, the first being that some lateral modes may be excited, perpendicular to the longitudinal mode that is excited by the fundamental frequency of an impinging wave. Parasitic modes may also occur where local pick-up occurs, whereby the piezoelectric material will vibrate, not at the location of the impinging wave but at some local area separate from that location. This results in a reduced signal-to-noise ratio.

The disadvantages of the 1-3 connectivity piezoelectric and polymer composite devices are primarily in the construction of said devices. Alignment of electrodes between subsequent layers is not a trivial task, as they are likely to be discrete and exact correspondence between layers is not always possible because the layers are typically manufactured separately.

It is an object of at least one aspect of the present invention to provide an apparatus to transmit and receive ultrasound that obviates and mitigates one or more of the disadvantages and limitations of the prior art.

It is a further object of at least one aspect of the present invention to provide a method of constructing an apparatus to transmit and receive ultrasound that obviates and mitigates one or more of the disadvantages and limitations of the prior art.

According to a first aspect of the present invention, there is provided a transducer for transmitting and receiving ultrasound waves, the transducer comprising a plurality of layers of a single crystal piezoelectric material stacked in a multilayer arrangement and a polymer material wherein the single crystal piezoelectric material and polymer material are geometrically arranged within each layer to form a 3-1 connectivity piezoelectric and polymer composite, and the multilayer arrangement includes at least two layers of different thickness.

Preferably, the each of the plurality of layers is of substantially uniform thickness.

Each of the plurality of layers may have a different thickness from other layers in the multilayer arrangement.

The varying thickness of the layers offers the significant advantage that the apparatus is sensitive to receiving even harmonics of the transmitted ultrasound, which is not feasible with layers of equal thickness.

Preferably the multilayer arrangement is arranged such that successive layers of the single crystal piezoelectric material have alternating poling directions.

Preferably the plurality of layers are bonded to one another.

Most preferably the piezoelectric material is a relaxor based piezoelectric material. Relaxor based piezoelectric materials exhibit relative insensitivity to temperature, and single crystals of some relaxor types exhibit very high electromechanical coupling factors.

Preferably the 3-1 connectivity composite comprises a plurality of longitudinally extending polymer slabs located in corresponding longitudinally extending slots. These slabs are mechanically continuous in one direction in accordance with the conventional connectivity notation of composite materials.

Advantageously, the width and breadth of each layer are significantly different from the thickness of each layer. This has the benefit that a parasitic mode can be decoupled from the vibrational mode excited by the impinging ultrasound wave. Filtering can thus be utilised to remove the signal frequency corresponding to the parasitic mode or modes.

Optionally the piezoelectric and polymer composite has a high volume fraction of piezoelectric material. A high volume fraction of piezoelectric material would be typically 60-70%. This will be most effective in functioning to convert electrical energy to transmit ultrasound waves.

Alternatively the piezoelectric and polymer composite has a low volume fraction of piezoelectric material. A low volume fraction of piezoelectric material would be typically 30-40%. This will be most effective in functioning to receive ultrasound waves and convert the energy into electricity.

Preferably the plurality of layers are arranged in planes perpendicular to the direction of polarisation of the piezoelectric material.

Preferably the multilayer arrangement further comprises interstitial electrical contacts on a top and a bottom face of each of the plurality of layers. These electrical contacts enable electrical coupling of opposing top and bottom faces of the plurality of layers, and enable coupling of the apparatus to a control system.

Alternatively the interstitial electrical contacts are formed on only one face of two contacting layer faces and are able to make electrical contact with an abutting face of an adjacent layer.

Preferably the electrical contacts extend partially onto at least one side face of each layer to form a side electrode.

According to a second aspect of the present invention, there is provided a method for constructing a transducer, the method comprising the steps of:

- Providing a plurality of layers of a single crystal piezoelectric material with different thicknesses;
- Stacking the plurality of layers to form a multilayer arrangement;
- Inserting a polymer material into the single crystal piezoelectric material such that the polymer material and the piezoelectric material form a 3-1 connectivity composite.

Preferably, each of the plurality of layers is of substantially uniform thickness.

Most preferably the method comprises the additional step of arranging the plurality of layers such that successive layers of single crystal piezoelectric material have alternating poling directions in the multilayer arrangement.

Preferably the method comprises the additional step of bonding the plurality of layers to one another.

Preferably the additional step of bonding the plurality of layers is carried out using a bonding agent and a press.

Preferably the method comprises the additional step of selecting the single crystal piezoelectric material from the group of materials termed relaxor based piezoelectric materials.

Preferably the step of inserting the polymer material into the single crystal piezoelectric material to form a 3-1 connectivity composite comprises the steps of:

- Cutting a plurality of discrete longitudinally extending slots into a side of the multilayer arrangement, the longitudinally extending slots also extending laterally into the multilayer arrangement;
- Filling the longitudinally extending slots with the polymer material.

Preferably the method comprises the step of creating interstitial electrical contacts on the top and bottom faces of the layers prior to the stacking of the plurality of layers.

Preferably the step of creating interstitial electrical contacts on the top and bottom faces of the layers is achieved by sputter coating an electrically conductive material onto each of the top and bottom faces of each of the layers.

Alternatively the interstitial electrical contacts are created by evaporative coating with an electrically conductive material.

Preferably the step of creating interstitial electrical contacts includes the additional step of providing electrically conductive material onto at least one side face of a layer.

Preferably the method further comprises the additional step of connecting the transducer to control instrumentation.

Preferably the additional step of connecting the transducer to the control instrumentation comprises the steps of:

- Connecting the side electrodes corresponding to each of the front face surface electrodes using a first wire;
- Connecting the side electrodes corresponding to each of the bottom face surface electrodes using a second wire;
- Coupling the first and second wires to the control instrumentation.

Optionally the method comprises the additional step of choosing the relative thicknesses of the layers to maximise the coupling of even harmonics. This is advantageous especially in terms of harmonic detection, for example in biomedical imaging to detect the second harmonic of a transmitted signal which is the result of the non-linear response of human tissue.

The present invention will now be described by way of example only and with reference to the accompanying figures in which.

Figure 3A:
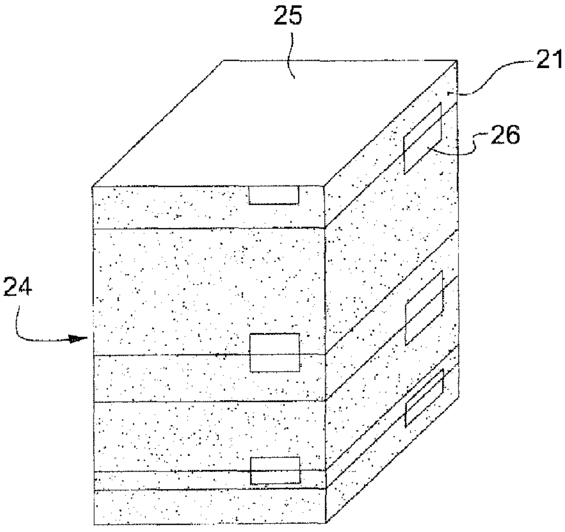
Figure 3B:
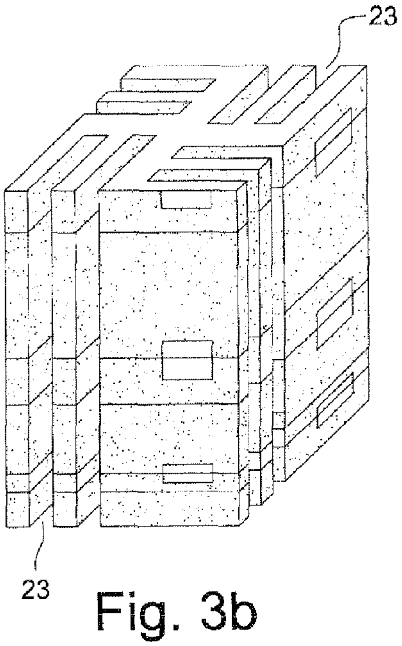
Figure 3C:
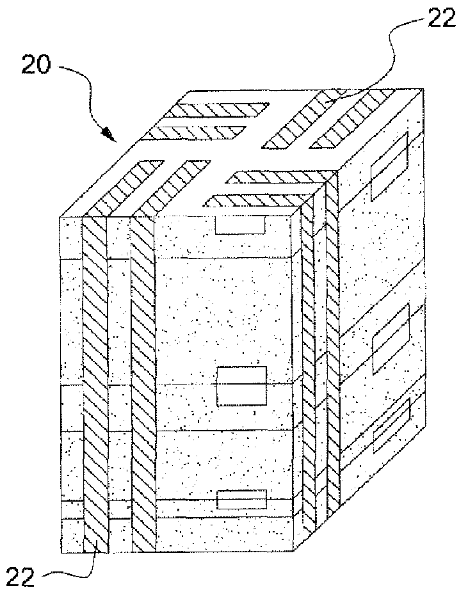
Figure 3D:
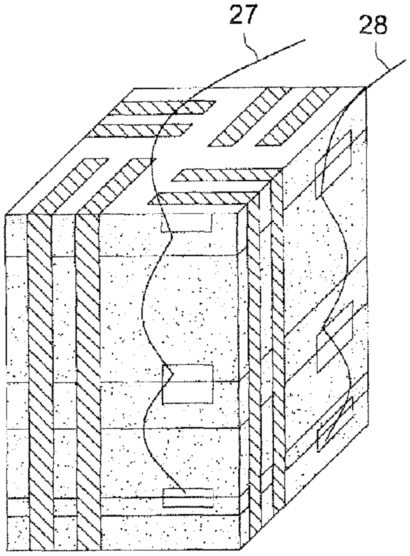
Figure 4A:
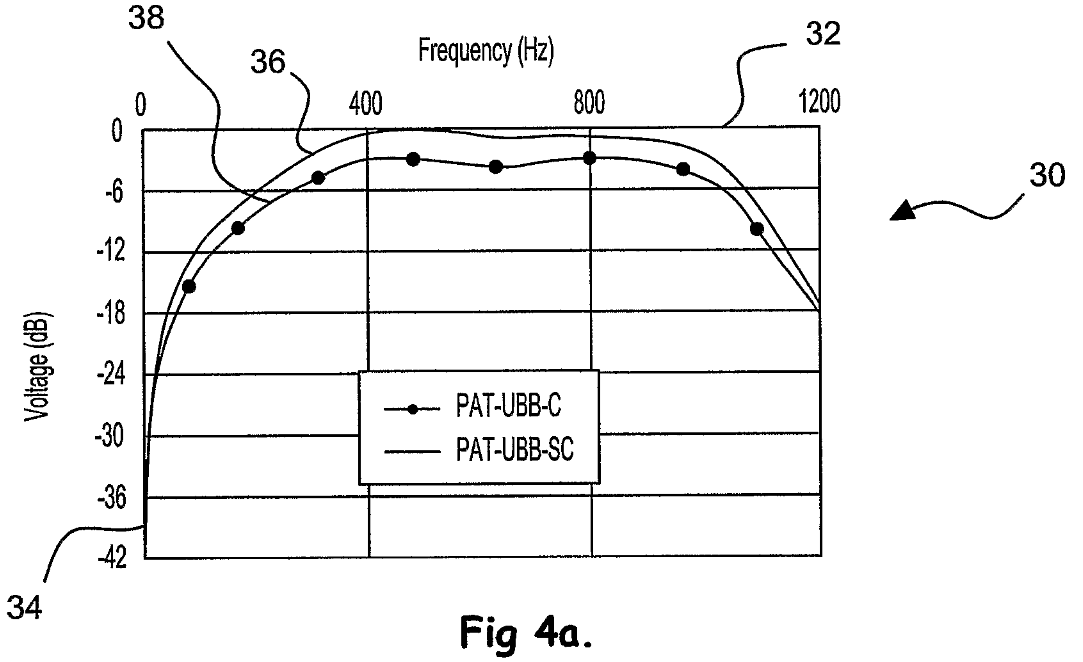
Figure 4B:
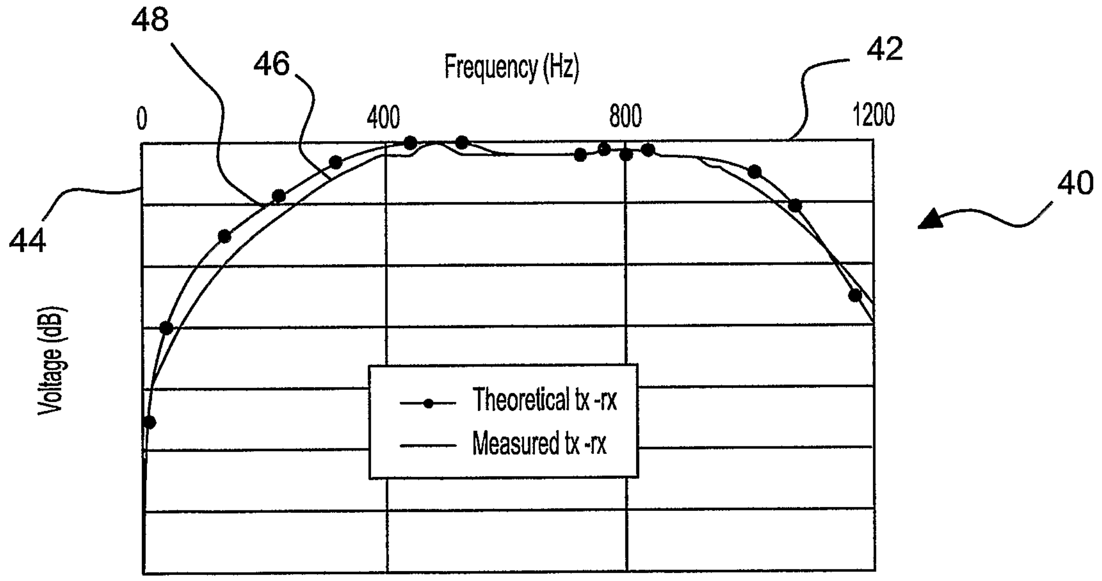

FIGS. 3*a* to 3*d* illustrate schematically the method by which an ultrawideband ultrasonic transducer may be manufactured, in accordance with an aspect of the present invention; and FIGS. 4*a* and 4*b* are graphs of frequency response for an embodiment of the apparatus of the present invention.

Figure 1:
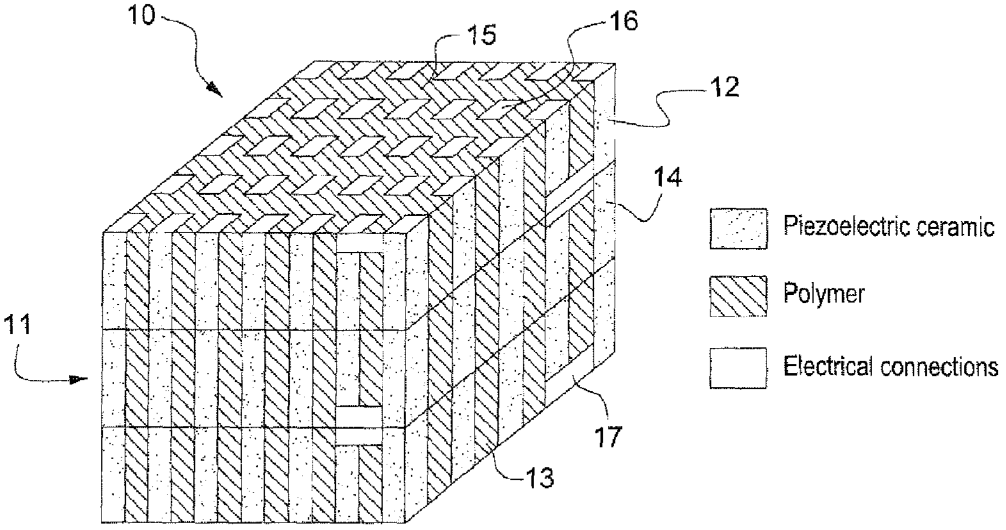
FIG. 1 illustrates in schematic form an ultrasonic transducer having 1-3 connectivity piezoelectric-polymer composite layers, in accordance with the present state of the art.

With initial reference to FIG. 1, an ultrasonic transducer 1 illustrative of the state of the art is presented. The transducer 10 comprises a number of stacked piezoelectric-polymer composite layers 11, the composite layers 11 being of 1-3 connectivity. 1-3 connectivity describes the condition where the piezoelectric material 12 is mechanically continuous in one direction, and the polymer material 13 is mechanically continuous in three directions. The piezoelectric material 12 in this example is mechanically continuous in the vertical direction.

For the purposes of the description of the embodiments herein, longitudinal refers to the direction perpendicular to the faces of the layers 11, 24 and subsequently the direction of stacking. Thickness refers to the dimension of each layer 11, 24, or the stack of layers 11, 24, in the longitudinal direction. Correspondingly, width and breadth refer to the perpendicular directions which are perpendicular to the longitudinal direction.

Each of the layers 11 consist of regularly distributed piezoelectric rods 14, supported by a polymer matrix 15. Surface electrodes 16 on the top and bottom surfaces of each piezoelectric pillar 14 allow interstitial electrical contact to successive layers 11. Side electrodes 17 allow electrical contact to interstitial electrical contacts to facilitate connection to control instrumentation (not shown).

Figure 2:
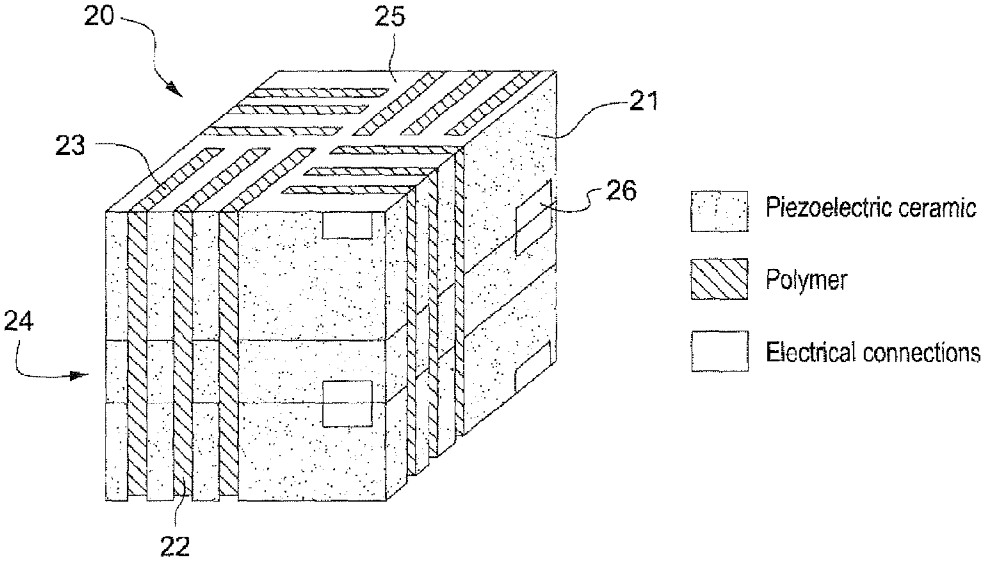
FIG. 2 illustrates in schematic form an ultrawideband ultrasonic transducer in accordance with an aspect of the present invention.

With reference to FIG. 2 there is presented an ultrawideband ultrasonic transducer 20 that functions to improve the transmission and reception of ultrasonic waves. The ultrasonic ultrawideband transducer 20 comprises multiple layers 24 of a single crystal piezoelectric material 21, and a plurality of polymer slabs 22 which are located within slots 23 cut in the single crystal material 21. The multiple layers are of varying thicknesses. Side electrodes 26 provide a means for electrical connections between the surface electrodes 25 and interstitial electrodes between the layers (not shown). Controlling the transducer 20, for example, by an electronic controlling device (not shown), can be achieved by connection to the side electrodes 26.

With reference to FIG. 3*a* to 3*d*, there is presented a method for constructing an ultrawideband ultrasonic transducer 20.

With reference to FIG. 3*a*, each layer 24 comprises an entirely single crystal piezoelectric material 21. These piezoelectric layers 24 have already been cut to the desired cuboid shape, and the surfaces polished to enable sputter or evaporative coating with an electrically conductive material. Each layer 24 of the transducer 20 is selected such that each of the layers 24 has a different thickness.

"Mathematical Optimisation of Multilayer Piezoelectric Devices with Non-uniform Layer Thicknesses by Simulated Annealing", Abrar, A. and Cochran, S., 2002, Proc. 2002 IEEE Ultrasonics Symposium pp. 1175-1178, incorporated herein by reference, describes a theoretical process of optimising transducer layer thicknesses in order to achieve a strong response extending over the fundamental and first two harmonics of the ultrasonic wave.

Each layer 24 has surface electrodes 25 covering the top and bottom faces of the layers 24, with two side electrodes 26 extending partially onto a side of the layer 24. One side electrode 26 is in electrical contact with the top surface electrode 25, and the other side electrode 26 is in electrical contact with the bottom surface electrode (not shown).

The layers 24 of piezoelectric material 21 are stacked with alternating poling directions. The stack is then bonded by using a bonding agent between the layers 24, and a bonding press (not shown). It is important at this stage to ensure that the side electrodes 26 are accessible for connections.

FIG. 3*b* and FIG. 3*c* illustrate schematically the so-called "Dice and Fill" stage. A dicing saw (not shown) is used to cut a number of longitudinal recesses 23 into the sides of the stack. These recesses 23 extend laterally into the stack, and are distinct, as indicated in FIG. 3*b*. FIG. 3*b* shows four sets of two longitudinal recesses 23, cut into each of the four sides of the stack. Each recess 23 is distinct from the other recesses. Dicing at this stage, after stacking and bonding the piezoelectric layers 24, prevents misalignment of interstitial electrodes (not shown).

The polymer material 22 is then used in a liquid state to fill the recesses 24, and left to set. Once set, the sides are ground to remove excess filler, resulting in a stack of piezoelectric layers 24 with continuous polymer slabs running longitudinally through. This method ensures continuity in the polymer slabs 22, and is illustrated in FIG. 5.

FIG. 3*d* illustrates schematically the ultrawideband ultrasonic transducer 20 as prepared for connecting to a control instrumentation (not shown). The end surfaces are lapped to a final desired thickness, whereupon the transducer 20 has reached the final stage of manufacture. Wires 27,28 are connected to the transducer, one set of wires 27 connects all the top surface electrodes 25 by connecting the respective side electrodes 26. A second set of wires 28 connects all the bottom surface electrodes (not shown) again by connecting the respective side electrodes 26.

The transducer as illustrated schematically in FIG. 3*d* is ready to be encapsulated in a suitable casing (not shown), once a matching layer (not shown) and a backing layer (not shown) have been applied. The matching layer functions to impedance match the incoming ultrasound to the transducer 20, and the backing layer acts as damping to the transducer 20.

3-1 connectivity clearly has significant manufacturing advantages which feed through to enhance performance compared with practical 1-3 connectivity multilayer devices.

Furthermore, 3-1 connectivity, in contrast to 1-3 connectivity, does not rely on the passive polymer phase allowing the piezoelectric elements to act alone. Instead, the 3-1 connectivity encourages the passive polymer and the active piezoelectric elements behave in a homogeneous fashion. This means that the entire surface of the device will exhibit the same behaviour.

A parasitic mode occurs when an area of the piezoelectric material vibrates under the influence of another local forced vibration instead of by direct forced vibration as occurs when an ultrasonic wave impinges on the transducer. 1-3 connectivity separates the piezoelectric material into separate pillars in order to prevent the transfer of vibrations from one area on the surface to another without direct stimulation.

In contrast, a 3-1 connectivity device as illustrated in FIG. 2 has a piezoelectric with mechanical continuity in 3 directions. As the method illustrated in FIGS. 3*a* to 3*d* shows, there is also continuity in the electrodes and in the polymer. This is in contrast with conventional 1-3 devices in which each layer is formed separately, and each layer must be carefully aligned.

Therefore, parasitic mode suppression is achieved with the 3-1 connectivity with relative ease, compared with a 1-3 device. As the thickness of the layers, which corresponds directly to the detection frequency, is distinct from the width and breadth, parasitic modes will oscillate at distinct frequencies from the impinging signal and facilitate removal by simple filtering techniques. The relative ease with which parasitic mode suppression occurs is due to the structural arrangement.

FIGS. 4*a* and 4*b* show the frequency response of a pair of ultrasound transducers. The graph 30 of FIG. 4*a* is a plot of frequency 32 against voltage 34 in the well known format used for providing frequency response data. Curve 36 is the frequency response curve for a new single crystal ceramic material used with the present invention and curve 38 is the frequency response for a conventional piezoceramic material. In both cases, the internal structure of the transducer generates odd and even harmonics, filling in the frequency nulls encountered with previous transducer designs, thereby allowing a significant increase in bandwidth without a corresponding reduction in signal amplitude or efficiency.

FIG. 4*b* shows a graph 40 of frequency response that shows the close match between the theoretical figure of curve 48 and the actual response of curve 46.

The multi-layer arrangement, having different thickness of layers, also provides significant advantages in that even harmonics can be detected as well as odd harmonics. As discussed, harmonic detection is one method of improving biomedical measurements.

By using single-crystal material, the enhanced performances achievable over conventional piezoelectric ceramics can be incorporated into the apparatus. Such advantages are higher piezoelectric coefficient and a high electromechanical coupling factor.

The combination of features serves to increase the bandwidth and effective surface area of ultrasonic transducers. By virtue of the performance of the apparatus, it is ideally suited to NDT of composite and forged materials.

The construction method herein described has a number of technical advantages, and a number of significant, advantageous consequences.

Construction of a 3-1 composite, multilayer device involves initially the layering of a number of piezoelectric slabs, with electrodes already formed on the top and bottom faces of each, and covering each face entirely. Therefore the electrodes are well aligned to make efficient electrical contact.

The state of the art in manufacturing 1-3 composite materials is to fabricate each composite layer separately, then to stack the composite layers to construct a multilayer device. The alignment of the electrodes in this case is not assured, and poses the technical requirement of an alignment procedure which is alleviated by the 3-1 composite construction method.

Single crystal piezoelectric materials also offer significant advantages. For example, single-crystal PMN-PT and PZN-PT elements exhibit ten times the strain of comparable polycrystalline lead-zirconate-titanate (PZT) elements.

Continuity in the electrodes is maintained as a result of the construction method herein described. This means that the enhanced electromechanical coupling afforded by single crystal piezoelectric and polymer composite materials is not compromised by poor coupling between the layers and subsequent poor coupling to control instrumentation.

The use of multiple layers of varying thicknesses is of additional technical benefit, the benefit being that even harmonics can be detected. For example, conventional transducers with multiple layers of equal, uniform thickness cannot detect even harmonics of a transmitted ultrasound wave, because the alternating layers produce a destructive interference effect.

Furthermore, the layer thicknesses may be engineered to tailor the device to a specific frequency or range of frequencies. For example, to enable lower frequency ultrasound transmission and/or detection the layer thickness can be increased. Conversely the layer thickness can be reduced in order to facilitate higher frequency operation.

By combining established techniques with new materials and new device structures, a significant enhancement in bandwidth is achieved. As the transducer is the key element of an ultrasound system, it essentially defines the performance envelope of the system. The enhanced bandwidth will feed through to enhancements in spatial range and spatial resolution of the system, enhancing system performance overall. Another advantage lies in the prospect that a single transducer, in accordance with the present invention, may be used to replace several devices in existing systems.

This enables the present invention to address the problems of a number of key fields of application; namely underwater sonar, biomedical imaging and non-destructive testing. The improved spatial range means that objects can be detected at longer distances or deeper depths, and the improved spatial resolution means that smaller items can be detected, with more positional accuracy and precision. For example, smaller flaws and finer cracks may be detectable within materials, with more accurate positional measurements. In addition, for the case of harmonic detection, the methods of layer thickness calculation described herein can permit a frequency response with less than 3 dB drop between harmonics, enhancing possibilities within biomedical imaging and any other measurement in which the nonlinear behaviour of the subject matter can be exploited.

Applications for the transducer are also envisaged in the automotive industry, where spot welds are routinely examined with handheld ultrasonic testers, and industrial processing.

Further modifications and improvements may be added without departing from the scope of the invention herein described.

The invention claimed is:

1. A transducer for transmitting and receiving ultrasound waves, the transducer comprising:

a plurality of layers, each layer comprising a single crystal piezoelectric material the layers being stacked in a multilayer arrangement; and a polymer material, wherein the single crystal piezoelectric material and the polymer material are geometrically arranged within each layer to form a 3-1 connectivity piezoelectric and polymer composite, and the multilayer arrangement includes at least two layers of different thickness.

2. A transducer as claimed in claim 1 wherein, the each of the plurality of layers is of substantially uniform thickness.

3. A transducer as claimed in claim 1 wherein each of the plurality of layers has a different thickness from other layers in the multilayer arrangement.

4. A transducer as claimed in claim 1, wherein the multilayer arrangement is arranged such that successive layers of the single crystal piezoelectric material have alternating poling directions.

5. A transducer as claimed in claim 1, wherein the plurality of layers are bonded to one another.

6. A transducer as claimed in claim 1, wherein the piezoelectric material is a relaxor based piezoelectric material.

7. A transducer as claimed in claim 1, wherein the 3-1 connectivity composite comprises a plurality of longitudinally extending polymer slabs located in corresponding longitudinally extending slots.

8. A transducer as claimed in claim 1, wherein the width and breadth of each layer are significantly different from the thickness of each layer in order to decouple a parasitic mode from the vibrational mode excited by impinging ultrasound wave.

9. A transducer as claimed in claim 1, wherein the piezoelectric and polymer composite has a high volume fraction of piezoelectric material.

10. A transducer as claimed in claim 9 wherein the volume fraction of piezoelectric material is between 60-70%.

11. A transducer as claimed in claim 1, wherein the piezoelectric and polymer composite has a low volume fraction of piezoelectric material.

12. A transducer as claimed in claim 11 wherein the volume fraction of piezoelectric material is between 30-40%.

13. A transducer as claimed in claim 1, wherein the plurality of layers are arranged in planes perpendicular to the direction of polarisation of the piezoelectric material.

14. A transducer as claimed in claim 1, wherein the multilayer arrangement further comprises interstitial electrical contacts on a top and a bottom face of each of the plurality of layers.

15. A transducer as claimed in claim 1, wherein the interstitial electrical contacts are formed on only one face of two contacting layer faces and are able to make electrical contact with an abutting face of an adjacent layer.

16. A transducer as claimed in claim 14, wherein the electrical contacts extend partially onto at least one side face of each layer to form a side electrode.

17. A method for constructing a transducer, the method comprising the steps of:

providing a plurality of layers of a single crystal piezoelectric material with different thicknesses;

stacking the plurality of layers to form a multilayer arrangement; and inserting a polymer material into the single crystal piezoelectric material such that the polymer material and the piezoelectric material form a 3-1 connectivity composite.

18. A method as claimed in claim 17 wherein, each of the plurality of layers is of substantially uniform thickness.

19. A method as claimed in claim 17, wherein the method comprises the additional step of arranging the plurality of layers such that successive layers of single crystal piezoelectric material have alternating poling directions in the multilayer arrangement.

20. A method as claimed in claim 17, wherein the method comprises the additional step of bonding the plurality of layers to one another.

21. A method as claimed in claim 20 wherein the additional step of bonding the plurality of layers is carried out using a bonding agent and a press.

22. A method as claimed in claim 17, wherein the method comprises the additional step of selecting the single crystal piezoelectric material from the group of materials termed relaxor based piezoelectric materials.

23. A method as claimed in claim 17 wherein the step of inserting the polymer material into the single crystal piezoelectric material to form a 3-1 connectivity composite comprises the steps of:

cutting a plurality of discrete longitudinally extending slots into a side of the multilayer arrangement, the longitudinally extending slots also extending laterally into the multilayer arrangement; and filling the longitudinally extending slots with the polymer material.

24. A method as claimed in claim 17, wherein the method comprises the step of creating interstitial electrical contacts on the top and bottom faces of the layers prior to the stacking of the plurality of layers.

25. A method as claimed in claim 24 wherein the step of creating interstitial electrical contacts on the top and bottom faces of the layers is achieved by sputter coating an electrically conductive material onto each of the top and bottom faces of each of the layers.

26. A method as claimed in claim 24 wherein the interstitial electrical contacts are created by evaporative coating with an electrically conductive material.

27. A method as claimed in claim 24, wherein the step of creating interstitial electrical contacts includes the additional step of providing electrically conductive material onto at least one side face of a layer.

28. A method as claimed in claim 24, wherein the method further comprises the additional step of connecting the transducer to control instrumentation.

29. A method as claimed in claim 28 wherein the additional step of connecting the transducer to the control instrumentation comprises the steps of:

connecting the side electrodes corresponding to each of the front face surface electrodes using a first wire;

connecting the side electrodes corresponding to each of the bottom face surface electrodes using a second wire; and coupling the first and second wires to the control instrumentation.

30. A method as claimed in claim 17, wherein the method comprises the additional step of choosing the relative thicknesses of the layers to maximise the coupling of even harmonics.

* * * * *

UNITED STATES PATENT AND TRADEMARK OFFICE

CERTIFICATE OF CORRECTION

PATENT NO. : 7,876,027 B2
APPLICATION NO. : 11/792582
DATED : January 25, 2011
INVENTOR(S) : Cochran et al.

It is certified that error appears in the above-identified patent and that said Letters Patent is hereby corrected as shown below:

On the Title Page, Item (75), third line, please delete "Pablo Martin Franch, Glasgow (GB);" and insert --Pablo Marin-Franch, Aberdeen (GB);--

At column 8, line 24, delete "piezoelectric material" and insert --piezoelectric material,--

Signed and Sealed this
Nineteenth Day of April, 2011

David J. Kappos

David J. Kappos
*Director of the United States Patent and Trademark Office*